(12) United States Patent
Sands

(10) Patent No.: US 6,472,877 B1
(45) Date of Patent: Oct. 29, 2002

(54) METHOD AND APPARATUS FOR MEASURING THE OPENING TIME OF A MEDIUM VOLTAGE AIR CIRCUIT BREAKER

(75) Inventor: John P. Sands, San Rafael, CA (US)

(73) Assignee: Chevron U.S.A., Inc., San Ramon, CA (US)

( * ) Notice: Subject to any disclaimer, the term of this patent is extended or adjusted under 35 U.S.C. 154(b) by 0 days.

(21) Appl. No.: 08/882,333

(22) Filed: Jun. 25, 1997

(51) Int. Cl.[7] ........................ G01R 31/327; H01H 47/00
(52) U.S. Cl. ........................ 324/423; 324/424; 361/195
(58) Field of Search ................................ 324/423, 420, 324/422, 424, 415; 361/195, 97

(56) References Cited

U.S. PATENT DOCUMENTS

| | | | |
|---|---|---|---|
| 3,878,436 A | * 4/1975 | Bogel | 361/72 |
| 3,988,664 A | * 10/1976 | Beery | 324/423 |
| 4,039,932 A | * 8/1977 | Duckworth | 324/423 |
| 4,105,965 A | * 8/1978 | Russel | 324/424 |
| 4,240,154 A | 12/1980 | Sekine | |
| 4,481,473 A | * 11/1984 | Compton | 324/423 |
| 4,858,058 A | 8/1989 | Ishii | |
| 4,918,566 A | 4/1990 | Brodsky et al. | |
| 4,922,363 A | 5/1990 | Long et al. | |
| 4,945,256 A | 7/1990 | Tada et al. | |
| 4,990,854 A | * 2/1991 | Friz | 324/423 |
| 4,994,934 A | 2/1991 | Bouhenguel | |
| 5,029,039 A | * 7/1991 | Yeh | 361/59 |
| 5,077,628 A | 12/1991 | Neuhouser | |
| 5,138,538 A | 8/1992 | Sperling | |
| 5,182,517 A | * 1/1993 | Thelen | 324/423 |
| 5,218,196 A | 6/1993 | Dogul et al. | |
| 5,241,444 A | 8/1993 | Yeh | |
| 5,245,289 A | * 9/1993 | Rumfield et al. | 324/424 |

FOREIGN PATENT DOCUMENTS

| | | | | |
|---|---|---|---|---|
| JP | 0176950 | * | 7/1989 | 324/423 |
| SU | 283401 | * | 10/1970 | 324/423 |

OTHER PUBLICATIONS

*Standard Handbook for Electrical Engineers,* Power–System Components, "Circuit Breakers", David S. Johnson et al., pp. 10–67 to 10–77 and 10–94 to 10–97.
Westinghouse Electric Corporation, Switchgear Division, Description–Installation–Maintenance Instructions, "Metal–Clad Switchgear with Type 'DH' Air Circuit Breakers", East Pittsburgh Plant, East Pittsburgh, PA, Apr. 1955, pp. 8 and 48–40.

* cited by examiner

Primary Examiner—N. Le
Assistant Examiner—Anjan K. Deb
(74) Attorney, Agent, or Firm—Burns, Doane, Swecker & Mathis, L.L.P.

(57) ABSTRACT

A circuit and method for measuring the switch opening time, in cycles, of a medium voltage air circuit breaker. The circuit senses DC current feeding the trip coil in the circuit breaker. The timer starts a predetermined programmable time interval after the DC current starts flowing in the breaker trip coil circuit. The timer stops when the DC current stops flowing in the breaker trip coil circuit. The programmable time interval is a delay between the opening of the breaker's primary contacts and the opening of the trip coil circuit switch, and is used to determine the circuit breaker opening time from the starting and stopping of the timer. The timing device does not require connection to the circuit breaker's main power contacts.

16 Claims, 2 Drawing Sheets

METHOD AND APPARATUS FOR MEASURING THE OPENING TIME OF A MEDIUM VOLTAGE AIR CIRCUIT BREAKER

FIELD OF THE INVENTION

The present invention relates generally to circuit breakers. More particularly, the present invention is directed to a circuit and method for measuring the switch opening time of a medium voltage air circuit breaker.

BACKGROUND OF THE INVENTION

Electrical power distribution systems and their components need protection from numerous types of malfunctions, including overcurrent conditions, overvoltage conditions, undervoltage conditions, reverse current flow, and unbalanced phase voltages. Accordingly, electrical distribution systems are provided with circuit breakers, which open to break the circuit a prescribed time after detection of a malfunction condition. The integrity of operability of any power distribution system ultimately depends on the proper functioning of the circuit breakers.

Circuit breakers are mechanical switching devices capable of making, carrying, and breaking currents under normal circuit conditions and also making, carrying for a specified time, and breaking currents under specified abnormal conditions such as those described above. The medium in which circuit interruption is performed may be designated by a suitable prefix, for example, air-blast circuit breaker, gas circuit breaker, oil circuit breaker, or vacuum circuit breaker.

Circuit breakers are rated by voltage, insulation level, current interrupting capabilities, transient recovery voltage, interruption time, and trip delay.

Regardless of the medium of arc quenching and insulation, each circuit breaker unit consists of the following construction elements: (1) main contact at system voltage, (2) insulation between main contact and ground potential (porcelain, oil, gas), (3) operating and supervisory devices as well as accessories out of reach of the system voltage-life zone, and (4) an insulated link between operating device and main contact.

In operation, a circuit breaker is opened by energizing a trip coil associated with the circuit breaker. Once the trip coil is energized, the main contacts are opened and then auxiliary contacts are opened to prevent damage to the trip coil.

A typical medium voltage (e.g., 15,000 volts) air circuit breaker, operating properly, opens in approximately 3-½ cycles, measured from the energizing of the circuit breaker trip coil until distinguishing of the arc between the main contacts and the system. The same breaker, if in need of repair, can take as long as 12 cycles to achieve circuit interruption. Typical circuit breakers can remain closed and in continuous service for many years. Due to the number of mechanical parts associated with a typical circuit breaker, circuit breakers often "stick" if the circuit breaker remains closed for an extended period of time. Lubricants do not adequately remedy this problem. Therefore, it is desirable to measure the circuit breaker's opening time the first time it is opened, and to remove the circuit breaker if it is defective (i.e., if the breaker does not open within a prescribed period of time).

Conventionally, circuit breakers are serviced periodically (e.g., once a year) by shutting down some portion of the power distribution system relatively long periods of time (e.g., hours). For complex power distribution system, it can be difficult to implement such a service program.

Therefore, it would be desirable to economically implement a circuit and method for measuring the opening time of a circuit breaker which minimizes disruption of the operation of the power distribution system.

SUMMARY OF THE INVENTION

The present invention overcomes the above-described problems, and provides additional advantages, by providing for a method and circuit for measuring the opening time of a circuit breaker which minimizes down time of the power distribution system and which is not connected to the main power contacts of the circuit breaker. The circuit is powered by the existing substation battery system. A sensing circuit senses a DC current energizing the trip coil in the circuit breaker and starts a timer a programmable time period after the current is sensed. The timer stops when the DC current stops flowing in the breaker trip coil circuit to measure the interruption time of the circuit breaker. The sensing means of the timing circuit includes a current transformer-type sensor, through which a trip coil circuit conductor passes.

The circuit according to the present invention advantageously does not require connection to the main power contacts of the circuit breaker, and therefore minimizes shut down time of the power distribution system to measure the switch time of the circuit breakers. According to the disclosed embodiment, the opening time can be measured within approximately 30 seconds.

BRIEF DESCRIPTION OF THE DRAWINGS

A more complete understanding of the present invention can be obtained upon reading the following Detailed Description of the Preferred Embodiments, in conjunction with the accompanying drawings, in which like reference indicia are used to designate like elements, and in which.

DETAILED DESCRIPTION OF THE PREFERRED EMBODIMENTS

Figure 1:
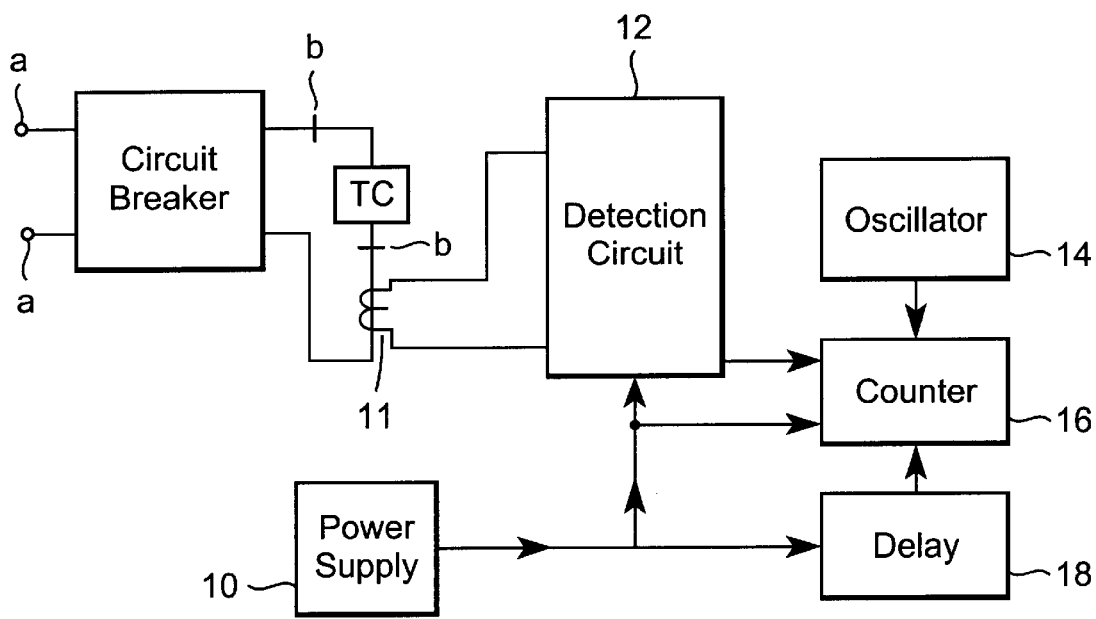
FIG. 1 a block diagram showing a conventional circuit breaker incorporating a circuit according to a first embodiment of the present invention.

Referring now to FIG. 1, a schematic diagram of a conventional circuit breaker incorporating a measuring circuit according to the present invention is shown. As is well known, the circuit breaker includes a set of primary contacts "a" which connect the circuit breaker to an associated power system (not shown) at system voltage, and a set of secondary contacts "b" on either side of a trip coil TC. To open the circuit breaker (e.g., in response to a fault), a DC current is provided to the trip coil TC. In response to the energizing of the trip coil TC, the primary contacts "a" open, followed by the opening of auxiliary contacts "b" to prevent damage to the trip coil TC.

A circuit breaker measuring circuit according to the present invention can be connected to each circuit breaker to be monitored in a power distribution system. The circuit according to the present invention includes a detection means such as a current sensing transformer 11 associated with the trip release coil TC of the circuit breaker. The current sensing transformer 11 is preferably embodied by a window-type current transformer in which a primary coil, in the form of a conductor connected to the trip coil, passes through a toroidal magnetic core having a secondary winding. It will be appreciated that other suitable current sensing means will be readily identifiable by those skilled in the art. The primary coil senses DC current flowing to the trip coil TC, and the secondary coil of the transformer 11 outputs an AC voltage proportional to the changing DC current through the primary coil. Since the primary coil current is a DC current, the AC secondary voltage is present only during a change of the primary current. The circuit is powered by a power supply 10, which accepts an input DC voltage within a range of approximately +43 to +138 volts, and provides outputs of approximately ±4.5 volts. The input voltage range allows the circuit to be powered from conventional substation battery systems, which are typically 48 VDC or 125 VDC. The circuit further includes a detection circuit 12 which senses DC current flowing through the trip coil TC of a circuit breaker. The detection circuit 12 outputs a START or STOP signal depending upon the current flow through the trip release coil, in a manner to be described below. The circuit further includes an oscillator circuit 14 for providing a reliable clock signal of, e.g., 30 kHz. The circuit also includes a counter/display driver 16 which displays the time it takes for the circuit breaker to open based on the START and STOP signals generated by the detection circuit 12 (i.e., the time duration of the energizing of the trip coil TC). The circuit further includes a programmable delay circuit 18, which is programmed according to the time, in cycles, between the opening of the main circuit breaker contacts "a" and the opening of the auxiliary contacts "b" that open circuit the trip coil. This time delay varies according to circuit breaker manufacturer and/or system type, and this delay can be subtracted from the START-STOP time to determine the opening time of the circuit breaker.

Figure 2:
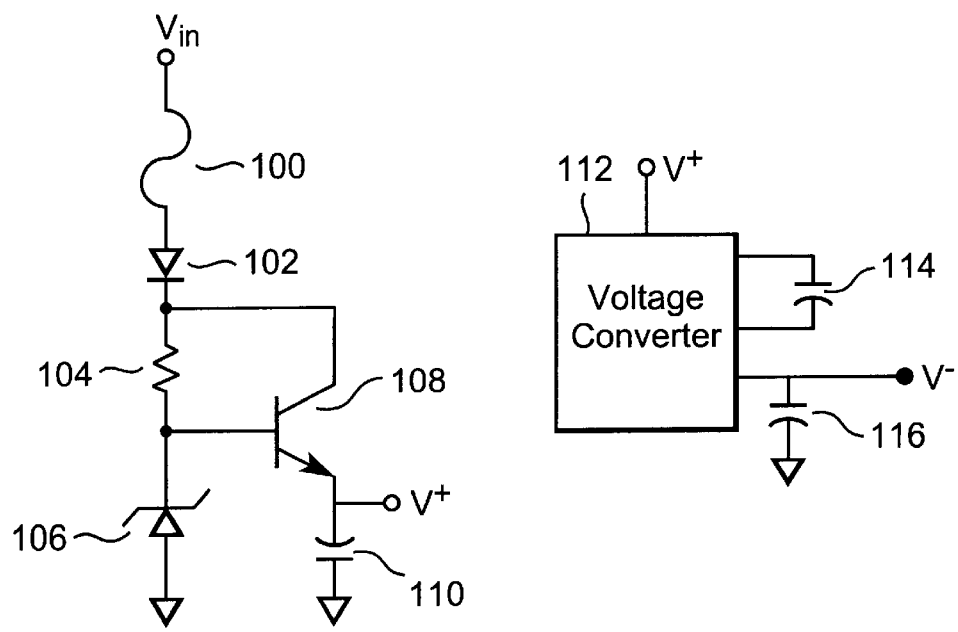
FIG. 2 is a schematic diagram of the power supply circuit of FIG. 1.

Referring now to FIG. 2, a detailed schematic diagram of an exemplary power supply for use with the present invention is shown. The power supply 10 is implemented in this embodiment by a V$^+$supply which includes a fuse 100, a rectifier diode 102, a voltage-reduction resistance 104, a zener diode 106, an NPN power transistor 108, and a capacitance 110, which are connected as shown. The power supply 10 receives an input voltage $V_{in}$ of, e.g., from +43 to +138 volts. The fuse 100 protects the substation battery subsystems in the event of a short circuit caused by internal electrical component failure. The rectifier diode 102 protects the power supply 10 from incorrect DC voltage polarity. The capacitance 110 filters the V$^+$voltage source during intermittent substation battery high current demands from other equipment. According to a preferred embodiment, the fuse 100 is a 0.25 amp fuse, the voltage reduction resistance 104 is a 27 kΩ resistor, and capacitance 110 is a 1000 uF capacitor.

The voltage supply includes a CMOS voltage converter 112, and capacitances 114 and 116. The converter 112 converts the V$^+$voltage into a corresponding negative voltage, and the capacitances 114 and 116 operate as charge pumps to provide energy transfer and storage. The V$^+$and V$^-$voltage supplies are preferably approximately +4.5V and −4.5V, respectively, as is necessary to provide power to CMOS circuitry.

Figure 3:
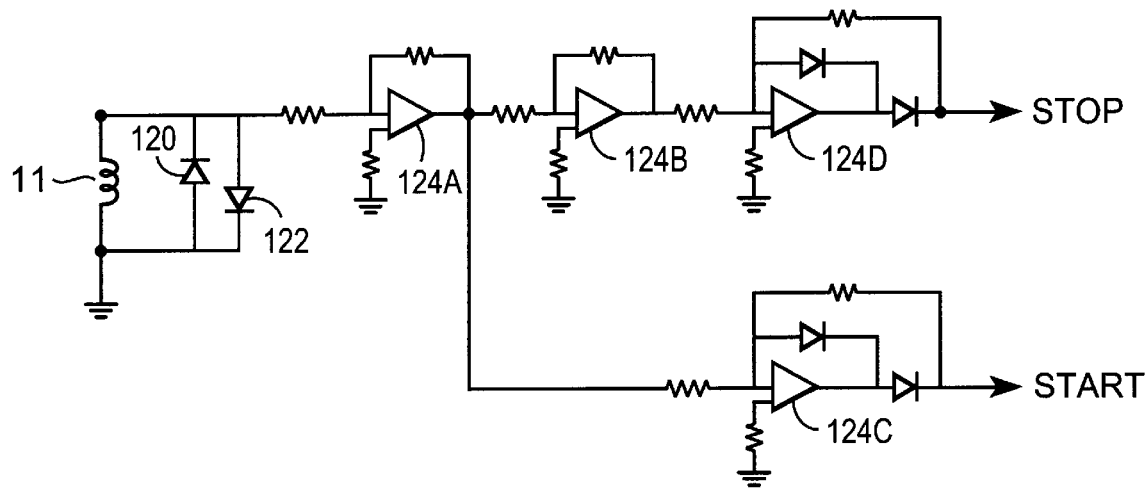
FIG. 3 is a schematic diagram of the detection circuit of FIG. 1.

Referring now to FIG. 3, the detection circuit 12 is shown to include diodes 120 and 122, which are connected in parallel with the sensing transformer 11, and in reverse directions. The diodes 120 and 122 operate as a "clipping" circuit to limit the voltage in the secondary winding of the transformer 11 to a range of approximately −0.6V to +0.6V. The output of the clipping circuit is a square wave. As DC current flows through the trip coil, magnetic flux in the transformer 11 increases, thus causing the secondary voltage across diode 120 to decrease to approximately −0.6V. Once the DC current through the trip coil reaches a steady state value, the magnetic flux stops increasing and the secondary voltage returns to substantially 0V. When the trip release coil circuit opens (as a result of the circuit breaker opening), the stored magnetic flux in the transformer 11 decreases, causing the secondary voltage to increase to approximately +0.6V. Once the magnetic flux is exhausted, the secondary voltage returns to substantially 0V. The square wave secondary voltage is supplied to analog amplifiers 124 to separate each non-zero pulse. The complete signal is inverted and amplified by a first operational amplifier 124A. The output of 124A is fed to unity gain inverter amplifier 124B, and to positive output inverting half-wave rectifier amplifier 124C. The output of amplifier 124B is supplied to positive output inverting half-wave rectifier amplifier 124D.

A V$^+$output pulse is generated by amplifier 124C when DC current starts flowing to the trip release coil of the circuit breaker. This V$^+$output pulse generated by the amplifier 124C is the START signal. A V$^+$output pulse is generated by amplifier 124D when DC current stops flowing to the trip release coil of the circuit breaker. This V$^+$output pulse generated by the amplifier 124D is the STOP signal. The START and STOP signals are supplied, via a latch or logic network (not shown) to the counter 16, such that the counter starts timing the circuit breaker in response to the START signal, and stops timing the circuit breaker in response to the STOP signal.

Figure 4:
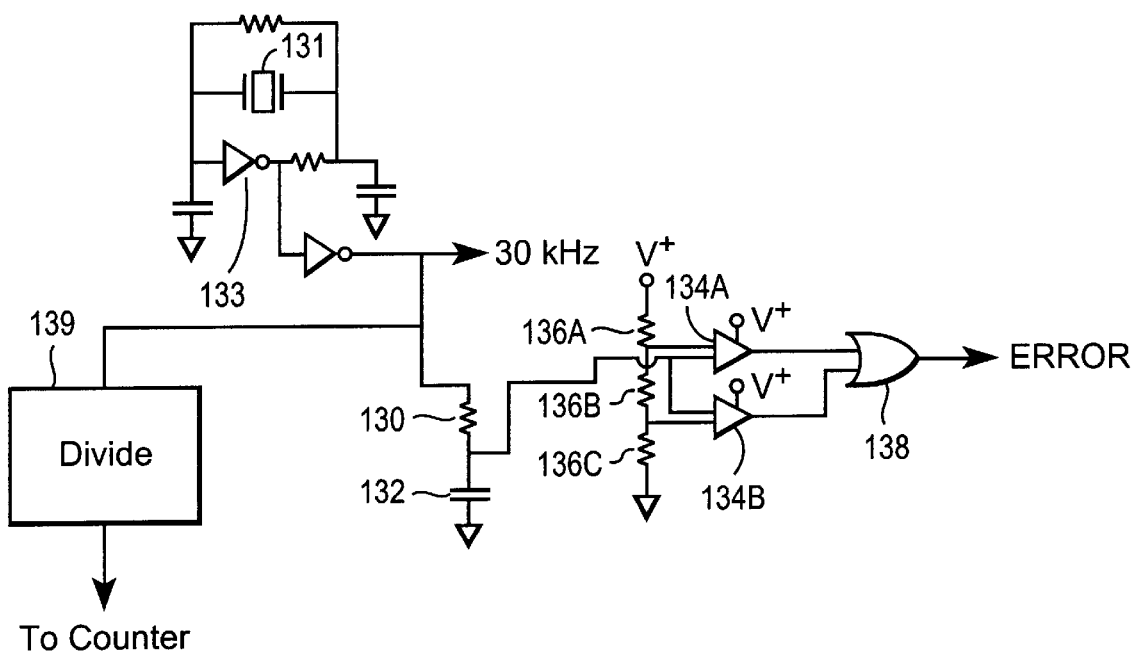
FIG. 4 is a schematic diagram of the oscillator circuit of FIG. 1.

Referring now to FIG. 4, the oscillator circuit 14 is shown to include a quartz crystal 131 and an amplifier 133. In this embodiment, the crystal 131 is a resonant circuit which oscillates at approximately 30 kHz, and outputs a square wave having a 50% duty cycle which switches between V$^+$(a "high" state) and ground (a "low" state). The crystal 131 is preferably a 30.00 kHz cylinder C-2 type quartz crystal 131. The oscillator circuit 14 preferably also includes means for detecting a malfunction. Such a means is implemented, in this embodiment, by an RC network including resistance 130 and capacitance 132, analog voltage comparators 134A and 134B, a voltage dividing network 136A,B,C which outputs ⅓ V$^+$and ⅔ V$^+$, and an OR gate 138. In this embodiment, the oscillator crystal output is supplied to resistance 130, and the output of the RC network is approximately 0.5V$^+$if the oscillator is operating properly; that is, switching between V$^+$and ground. If the oscillator has stopped, the RC network will output the same voltage level as the oscillator (i.e., V$^+$or ground). Voltage comparator 134A outputs a low state unless the output of the RC network is greater than ⅔ V$^+$, and voltage comparator 134B outputs a low state unless the output of the RC network is less than ⅓ V$^+$. The oscillator circuit 14 preferably also includes a divide by 50 counter 139 for generating a 600 Hz clock signal for the counter 16. Such a counter can be implemented by a 12-bit binary counter or other suitable component.

The counter/display driver 16 calculates and displays the time, preferably to a tenth of a cycle (where a cycle, in this example, is ¹⁄₆₀ second), that it takes for the circuit breaker to open. This time is calculated as the difference between the START and STOP signals, as adjusted by the programmable start delay time. Preferably, the counter/display driver 16 is implemented using a 4553 single chip three-digit BCD counter and multiplexing the BCD outputs to three LCD digit drivers implemented by conventional 4543 BCD-to-seven segment latch/decoder/drivers for liquid crystal displays. The counter receives an input from the oscillator circuit 14 and the detection circuit 12 and calculates the opening time from the START and STOP signals provided by detection circuit 12.

The delay circuit 18 can be implemented by a 74HC688 8-bit magnitude comparator in combination with a 4040 12-bit binary counter, or other suitable circuitry, to provide a programmable time delay to offset the calculated time between the START and STOP signals by the delay time which typically varies between circuit breaker type and manufacturer. The programmable time delay can be set by an electrician or installer of the circuit breaker time circuit of the present invention. Further, it will be appreciated that a mechanical contact "bounce" will occur at the opening of the circuit breaker, that is, the contacts will typically open and close multiple times before stabilizing in the open position.

Accordingly, the delay circuit 18 can also include a stop delay function to program a stop delay time, in cycles, to compensate for the mechanical contract bounce of the relay contacts. An exemplary time delay is 0.2 cycles. The stop delay function can be implemented by a 4585 4-bit magnitude comparator or other suitable circuitry.

A circuit breaker timing device according to the disclosed embodiments and principles allows the circuit breaker to be closed substantially immediately after being opened to measure the opening time. Conventional circuits and methods require placing the circuit breaker out of service for several hours. In contrast, the timing device of the present invention can measure the opening time in approximately thirty seconds.

While the foregoing description includes numerous details and specificities, it is to be understood that these are for purposes of explanation only. Many modifications will be readily apparent to those of ordinary skill in the art which are clearly within the spirit and scope of the invention, as defined by the following claims and their legal equivalents.

What is claimed is:

1. A timing device for measuring the switch time of a circuit breaker, comprising:
    sensing means for sensing a DC current flowing through a trip coil in the circuit breaker; and
    timer starting means for causing a timer to start a predetermined time period after the sensing of the DC current; and
    timer stopping means for stopping the timer when the DC current stops flowing through the trip coil to measure the switch time of the circuit breaker.

2. The device of claim 1, wherein the predetermined time period is a time difference between an opening of primary circuit breaker contacts and an opening of auxiliary trip coil contacts.

3. The device of claim 1, wherein the sensing means includes a current transformer.

4. The device of claim 3, wherein the current transformer is a window-type current transformer.

5. The device of claim 1, further comprising a power supply which converts a circuit breaker power input from a substation battery system into a positive and negative voltage supply.

6. The device of claim 5, wherein the positive voltage supply is approximately +4.5V and the negative voltage supply is approximately −4.5V.

7. The device of claim 1, further comprising means for programming the predetermined time period.

8. The device of claim 1, further comprising timer stopping offset means for adjusting the measured switch time by a programmable time period corresponding to an anticipated contact bounce.

9. A method for measuring the switch time of a circuit breaker, comprising the steps of:
    sensing a DC current flowing through a trip coil in the circuit breaker;
    starting a timer a predetermined time period after the sensing of the DC current; and
    stopping the timer when the DC current stops flowing through the trip coil to measure the switch time of the circuit breaker.

10. The method of claim 9, further comprising the step of adjusting the measured switch time by an offset value corresponding to an anticipated contact bounce time.

11. The method of claim 9, further comprising the step of programming the predetermined time period based on an expected time difference between opening of primary circuit breaker contacts and auxiliary trip coil contacts.

12. The method of claim 9, wherein the step of sensing is performed by a window-type current transformer.

13. An apparatus for measuring switch time of a circuit breaker comprising:
    a detection circuit which senses current flowing through a trip coil in the circuit breaker and generates a start signal and a stop signal responsive thereto; and
    a counter circuit for starting and stopping a timer in response to said start and stop signals, respectively, from said detection circuit.

14. The apparatus of claim 13, further comprising:
    a delay circuit for offsetting the starting or the stopping of said timer.

15. The apparatus of claim 13, wherein said counter circuit comprises a display circuit for displaying the switch time of said circuit breaker.

16. The apparatus of claim 14, wherein said delay circuit provides an offset value which is based upon a type of said circuit breaker.

* * * * *